United States Patent [19]
Cliff et al.

[11] Patent Number: 5,563,592
[45] Date of Patent: Oct. 8, 1996

[54] PROGRAMMABLE LOGIC DEVICE HAVING A COMPRESSED CONFIGURATION FILE AND ASSOCIATED DECOMPRESSION

[75] Inventors: Richard G. Cliff, Milpitas; L. Todd Cope, San Jose, both of Calif.

[73] Assignee: Altera Corporation, San Jose, Calif.

[21] Appl. No.: 156,561

[22] Filed: Nov. 22, 1993

[51] Int. Cl.$^6$ ................................................ H03M 7/46
[52] U.S. Cl. ........................................ 341/63; 364/715.02
[58] Field of Search .................. 341/63, 64; 364/715.03, 364/715.02, 715.09

[56] References Cited

U.S. PATENT DOCUMENTS

| | | | |
|---|---|---|---|
| 4,446,516 | 5/1984 | Nishimura | 341/63 |
| 4,791,660 | 12/1988 | Oye et al. | 379/88 |
| 5,258,932 | 11/1993 | Matsuzaki | 364/578 |
| 5,260,610 | 11/1993 | Pedersen et al. | 326/41 |
| 5,260,611 | 11/1993 | Cliff et al. | 326/39 |
| 5,440,718 | 8/1995 | Kumagai et al. | 395/481 |

FOREIGN PATENT DOCUMENTS 0500267  8/1992  European Pat. Off. .

OTHER PUBLICATIONS

Jock Tomlinson et al., "Designing with reprogrammable FPGAs", *Australian Electronics Engineering*, Feb. 1993, 67–70.

Shih–Fu Chang et al., "Designing High–Throughput VLC Decoder Part I—Concurrent VLSI Architectures", *IEEE Transactions on Circuits and Systems for Video Technology*, (Jun. 1992) 2:2:187–96.

Ming–Ting Sun et al., "High–Speed Programmable ICs for Decoding of Variable–Length Codes", *SPIE*, (1989) 1153:28–39.

Shih–Fu Chang et al., "VLSI Designs for High–Speed Huffman Decoder", *IEEE International Conference on Computer Design: VLSI in Computers and Processors*, (1991), pp. 500–503.

J. C. Vermeulen, "Logarithmic Counter Array with Fast Access", *IBM Technical Disclosure Bulletin*, (Nov. 1984), 27:6:3380–3381.

*Primary Examiner*—Howard L. Williams
*Attorney, Agent, or Firm*—Townsend and Townsend and Crew LLP

[57] ABSTRACT

A method of utilizing compression in programming programmable logic devices is disclosed. The present invention compresses the configuration file to be used in programming a programmable logic device. The compression step reduces the size of the configuration file. The reduction in the size of the compression file results in the reduction in the size of the memory device used to store the configuration file before it is used to program the programmable logic device.

34 Claims, 8 Drawing Sheets

PROGRAMMABLE LOGIC DEVICE HAVING A COMPRESSED CONFIGURATION FILE AND ASSOCIATED DECOMPRESSION

BACKGROUND OF THE INVENTION

The present invention relates to the field of data processing. In particular, it relates to the use of data compression in for transmitting and storing configuration data for programming programmable logic devices.

Today's advanced technology has provided for design, development and manufacturing of complicated programmable logic devices. Such devices include those described in U.S. Pat. Nos. 5,260,610 and 5,260,611, incorporated herein by reference for all purposes. These devices include numerous programmable elements to provide flexibility. By programming these programmable elements, the user defines the function that the programmable logic device must perform. Configuration files are used to program the programmable logic devices. A typical configuration file includes at least one memory pattern. The memory pattern includes a series of low "0" and high "1" bits which are used to program the individual programming elements. Configuration files are stored on the PLD or in memory associated with the PLD and are loaded onto the PLD at power-up or when the PLD system receives a signal to reconfigure the PLD.

Typically, a configuration file includes more than one memory pattern. It is also possible that more than one configuration file are used to program a typical programmable logic device. The configuration files are usually stored in memory banks and are individually retrieved to program the corresponding programmable logic device. Typically, EPROMs are used to store the configuration files.

As the complexity of the programmable logic devices grows, so does the number of programmable elements used. This requires configuration files with a greater number of "1s" and "0s" to program the programmable memory devices. As the size of the configuration files increases, so does the size of the EPROMs needed to store them. Large EPROMs are expensive and require large silicon area to be manufactured. The size of the silicon area is more important when the EPROM is manufactured on the same substrate as the programmable logic device. The size of the EPROMs limit the complexity of the programmable logic device.

From the foregoing, it can be appreciated that there is a need for an apparatus and method of reducing the size of the configuration files before they are stored in memory, particularly where the configuration files are stored in memory located on the same substrate as the PLD.

SUMMARY OF THE INVENTION

The method and apparatus of the present invention compress the data file which is used to program a particular programmable logic device. The compressed data file is then stored in a memory element. Once it is necessary to program the programmable logic device, the compressed data file is decompressed and then is used to program the programmable logic device.

In one embodiment of the present invention, the compression and decompression are done by hardware. In a second embodiment, the compression is done by software external to the PL and the decompression is done by hardware either located on the PLD, or closely associated with the PLD and an external configuration file memory.

Therefore, the present invention offers a solution to the problems caused by storage of large memory patterns that are used in programming the programmable logic devices.

Other advantages of the present invention will be more evident as the invention is disclosed in the ensuing detailed description of the invention and claims.

DESCRIPTION OF THE PREFERRED EMBODIMENTS

The present invention offers a solution to the problem of storing large configuration files. By reducing the number of bits in an individual configuration file through compression, the present invention eliminates the need for large memory elements either associated with or on the PLD in which to store them.

Figure 1:
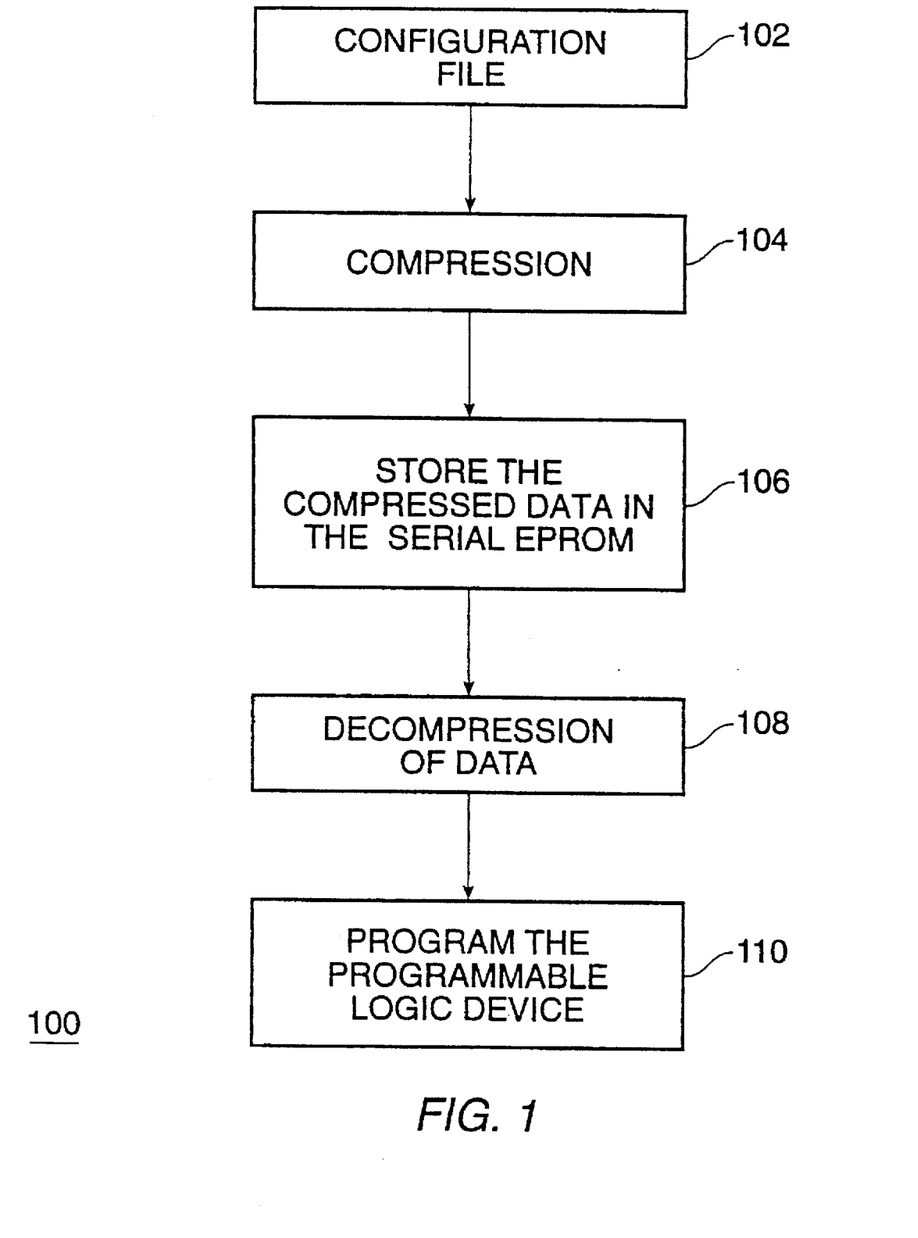
FIG. 1 illustrates the preferred embodiment of the method of the present invention.

FIG. 1 illustrates a flow chart showing the steps of the method of the present invention. Process 100 first inputs the configuration file in step 102. The configuration file is then compressed in step 104 using a software compression algorithm or a hardware compression circuit. The compression step reduces the number of bits in the configuration file by a ratio of as much as 2 to 1. The compressed configuration file is then stored in a memory element, such as a serial EPROM, in step 106. Since the size of the generated configuration file is substantially smaller than the original configuration file, a memory element with smaller storage capacity can be used to store the generated file.

To program the programmable logic device, the original configuration file must be recreated. In step 108, the compressed configuration file is decompressed using a decompression circuit. Finally, in step 110, the configuration file generated in step 108 is used to program the programmable logic device.

In addition to reducing the size of the memory element, the reduction of the size of the individual configuration files allows for storing more than one configuration file in a single memory element. This eliminates the need for multiple memory elements where more than one configuration file can be used to program a programmable logic device.

Figure 2:
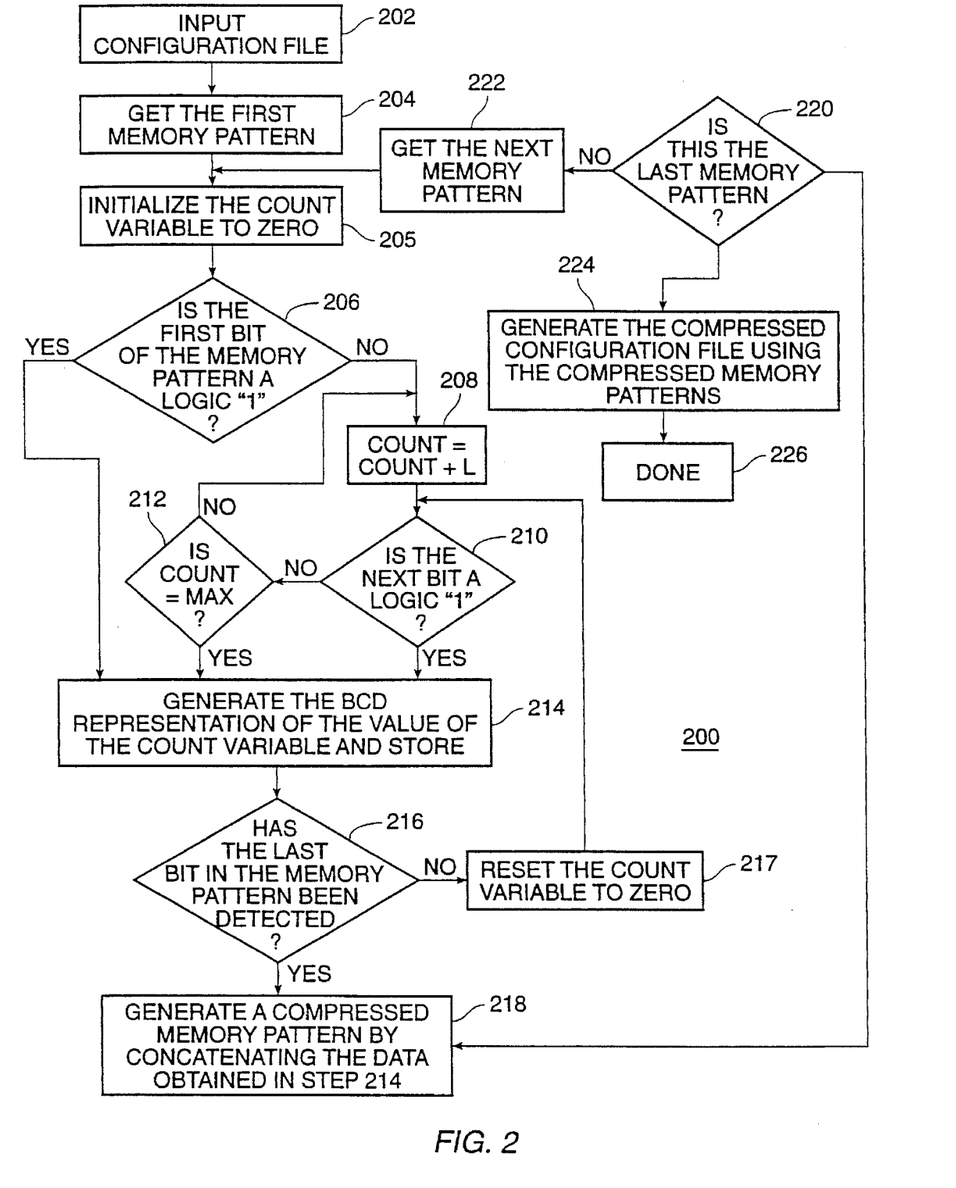
FIG. 2 is a flow chart showing the preferred method of performing the compression in the present invention.

As mentioned above, the compression step can be performed by software or hardware. The flow chart of FIG. 2 shows the preferred method of performing the compression step 104 in FIG. 1. The compression process shown in FIG. 2 begins by inputting a configuration file as shown in step 202. This configuration file is typically stored in the memory of the host processing unit. This processing unit (shown in FIGS. 6 and 7) executes the software realizing the steps shown in the flowchart FIG. 2. As mentioned above, a typical configuration file includes at least one memory pattern which is used to program the programmable logic device. However, almost always, configuration files include more than one memory pattern.

Process 200 continues by obtaining the first memory pattern to be compressed in step 204. In step 205, the value of a count variable is initialized to zero. The count variable is used to keep track of the number of low bits between two high bits in the memory pattern. As mentioned above, a low bit refers to a logic "0" bit and a high bit refers to a logic "1" bit. In step 206, the first bit of information in the memory pattern is examined. If the first bit is a high bit, the process proceeds to step 214, which will be described later.

If the first bit is a low bit, process 200 increments the value of the count variable and proceeds to step 210. In step 210, the next bit is examined. If the next bit is a high bit, process 200 proceeds to step 214. If the next bit is a low bit, process 200 proceeds to step 212. In step 212, the value of the count variable is examined to determine whether it has reached a maximum preset value. If the value of the count variable is equal to the maximum value, then process 200 proceeds to step 214, otherwise, it returns to step 208 and proceeds as explained above.

The maximum preset value of the count variable depends on the representation scheme used in step 214. For example, in the embodiment of the present invention, a Binary Coded Hexadecimal Representation ("BCH") representation of the value of the count variable is generated at step 214. It is well known in the art that four bits are used to generate the BCH representation of a single hexadecimal digit number. It is also well known that the maximum hexadecimal decimal number that can be represented by four bits is hexadecimal F or decimal fifteen. Therefore, in the present embodiment, the maximum preset value of the count variable is set to fifteen. Obviously, this number can change depending on the different schemes used to represent the value of the count variable.

Three different alternatives to reach step 214 are described above. While in step 214, process 200 generates the BCH representation of the value of the count variable. The outcome of step 214 is stored in memory and will be retrieved later to construct the compressed configuration file. In step 216, process 200 determines whether the last bit in the memory pattern was just examined. If the answer to step 216 is no, process 200 resets the value of the count variable to zero in step 212, returns to step 210, and proceeds as described above. If the answer to step 216 is yes, process 200 constructs the compressed memory pattern by retrieving and concatenating the BCH representations of the current memory pattern. The compressed memory pattern is stored in the memory of the host processor.

After step 218, process 200 proceeds by determining whether the current memory pattern is the last memory pattern in the configuration file in step 220. If the answer is no, process 200 retrieves the next memory pattern in the configuration file from the memory of the host processor, returns to step 205, and continues as described above. If the answer to step 220 is yes, process 200 generates the compressed version of the configuration file in step 224. This is done by retrieving the compressed memory patterns from the memory of the host processor and forming a file from all compressed memory patterns.

Figure 3:
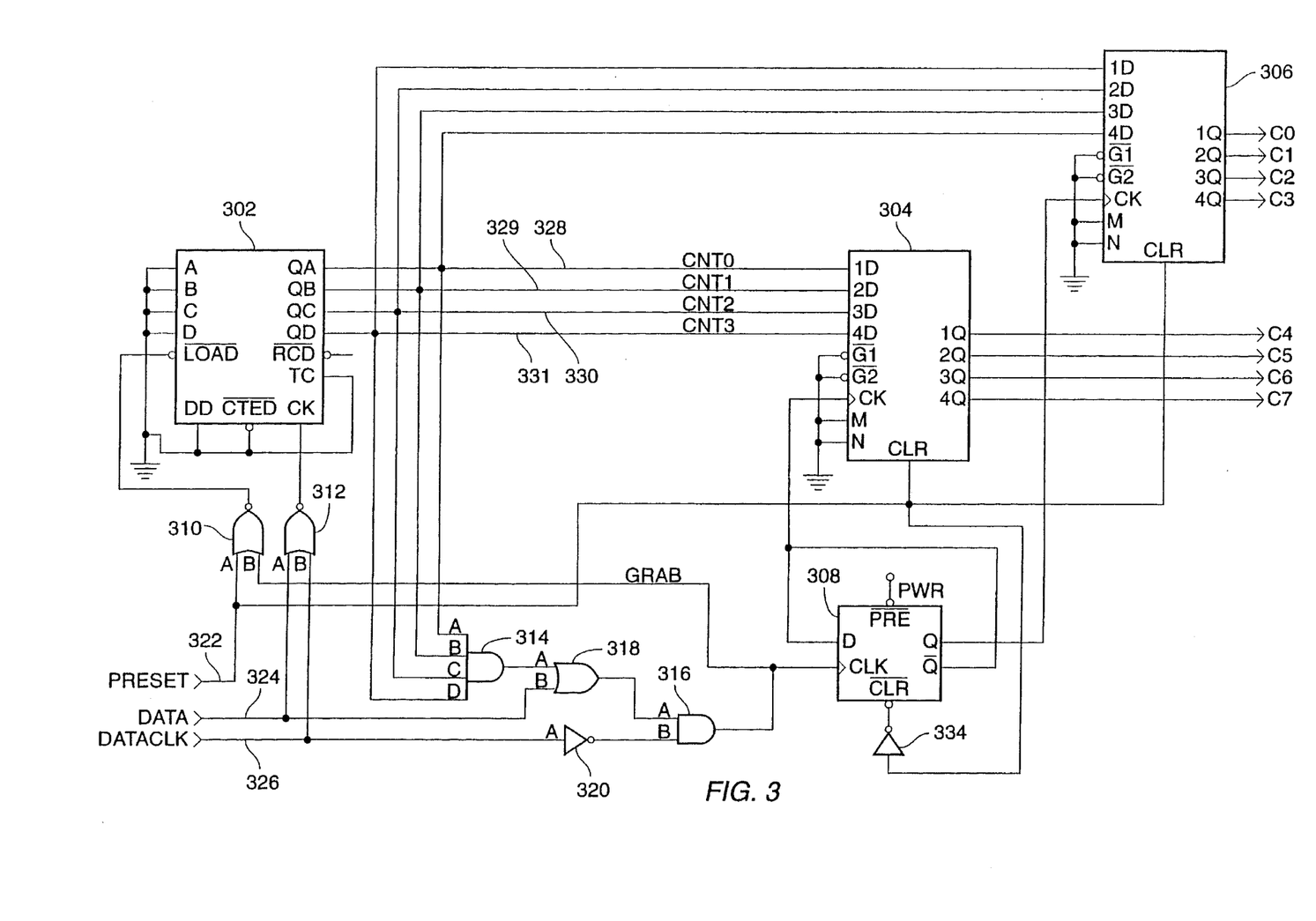
FIG. 3 shows a circuit diagram of a compression circuit.

FIG. 3 illustrates an electronic circuit 300 which performs the compression step 104 in FIG. 1 using hardware. Circuit 300 includes a counter 302, 4-bit registers 304 and 306, "D" flip-flop ("FF") 308, NOR gates 310 and 312, 4-input AND gate 314, AND gate 316, OR gate 318, and invertors 320 and 334.

Counter 302 is used to count the number of low bits between two high bits in a memory pattern. Counter 302 includes four inputs A–D, a LOAD input which is asserted when connected to a low level signal, a clock input "CK", and four outputs 328–332. It should be realized that a low level signal is realized by providing ground potential at the prospective inputs. The information on inputs A–D when loaded in counter 302 provides the initial count value of counter 302. In operation, counter 302 counts up or down from this initial count value. For example, if inputs A and B carry a low level signal and inputs C and D carry a high level signal, the initial value of counter 302 is three. In the embodiment of FIG. 3, inputs A–D are permanently connected to a low level signal. Outputs 328–331 carry the binary equivalent of the latest count value of the counter. Inputs A–D are loaded in counter 302 when a low level signal appears on LOAD input 332.

Outputs 328–331 are connected to inputs 1D–4D of both 4-bit registers 304 and 306. This allows for latching the information on outputs 328–331 in registers 304 and 306. Each of the two registers 304 and 306 further includes a clear input ("CLR"), a clock input and other inputs that are connected to ground potential as shown in FIG. 3. The CLR input of both registers 304 and 306 are connected to GRESET signal 322. GRESET input is used to initialize circuit 300, as will be described later. The CK input of register 304 is connected to the inverse Q output of FF 308 and the CK input of register 306 is connected to the Q output of FF 308.

The D input of FF 308 is connected to its inverse Q output and its clock input is connected to the output of AND gate 316. The signal at the output of AND gate 316 is also referred to as the GRAB signal 336. As it will be more clearly described below, a high to low or a low to high transition of the GRAB signal is used to latch the information on outputs 328–331. FF 308 further includes a CLR input which is connected to the output of invertor 334. Invertor 334 generates a clear signal to clear FF 308 by inverting the GRESET signal 322. The A input of AND gate 316 is connected to the output of OR gate 318, and the B input of AND gate 316 is connected to the output of invertor 320. The input of invertor 320 is connected to DATACLK signal 326, which is the system clock signal. The A input of OR gate 318 is connected to the output of AND gate 314 and its B input is connected to the DATA input terminal 324. The individual bits of each memory pattern serially enters compression circuit 300 via DATA input terminal 324.

The inputs of AND gate 314 are connected to outputs 328–331. DATA input terminal 324 and DATACLK signal 326 are also connected to A and B inputs of NOR gate 312, respectively. The A and B inputs of NOR gate 310 are connected to the GRESET signal 322 and GRAB signal 336, respectively.

Circuit 300 operates as follows. A high level signal connected to GRESET signal 322 forces NOR gate 310 to generate a low signal at its output. This places a low level signal at the LOAD input of counter 302, which loads in the information on its inputs. GRESET signal 322 is also used to clear registers 304 and 306, and FF 308 via invertor 334. With FF 308 cleared, a low level signal appears at its Q output and a high level signal appears at its inverse Q output.

To begin the compression, a low level signal is applied to GRESET 322. As mentioned before, the information bits in the memory pattern serially enters circuit 300 via DATA input terminal 324. As long as low level bits are inputted, the output of NOR gate 312 follows the clock input at DATA-CLK terminal 326. This provides a clock signal at the CK input of counter 302 which forces counter 302 to count. In the embodiment of FIG. 3, counter 302 counts up from the initial count value. Thus, so far, the counter is counting the number of low level bits in the memory pattern.

Once the first high level bit appears at DATA input terminal 324, the output of NOR gate 312 is forced to a low level. This stops the clock signal at the CK input of counter 302, thus stopping counter 302 from further counting. A high level bit at DATA input terminal 324 also forces the output of OR gate 318 to high, which forces the output of AND gate 316 to follow the clock signal at the output of invertor 320. Invertor 320 inverts the clock signal received at DATACLK terminal 326.

As mentioned above, the output of AND gate 316 is connected to the CLK input of FF 308, and the inverse Q of FF 308 is set to high once FF 308 is cleared. This places a high level signal at the D input of FF 308. Therefore, the first high to low transition of the clock signal at the output of AND gate 316 forces the Q output of FF 308 to high level. A transition from low to high at the Q output of FF 308 provides a clock signal for register 306, thus causing the information on outputs 328–331 to be latched in register 306.

The above occurs during a single high to low transition of the signal at the output of AND gate 316. This signal is referred to as the GRAB signal. The next transition from a low to a high level at the output of AND gate 316 forces the output of NOR gate 310 to low, which provides a load signal to counter 302. Counter 302 is then reloaded with the initial value of zero.

The next time that a high bit is detected, again the output of OR gate 318 switches to high level, which forces the output of AND gate 316 to follow the clock signal at the output of invertor 320. This time, a transition from low to high at the output of AND gate 316 forces the Q output of FF 308 to a low level, and low to high at the inverse Q of FF 308 provides a clock signal for register 304, which allows the information on outputs 328–331 to be latched into register 304. This is the second GRAB signal.

Above, we described how the GRAB signals are generated if a high bit is detected after a low bit. If the number of low bits between two high bits are more than a present maximum number, circuit 300 generates a GRAB signal. If the counter counts to the maximum value, then outputs 328–331 will all carry high level signals. This forces the output of AND gate 314 to high, which forces the output of OR gate 318 to high. The rest of the operation is similar to what has been described above. In the embodiment of FIG. 3, the maximum count is fifteen. Therefore, if there are more than fifteen logic "0s" between two logic "1s" in the memory pattern, a GRAB signal is generated by circuit 300.

Figure 4:
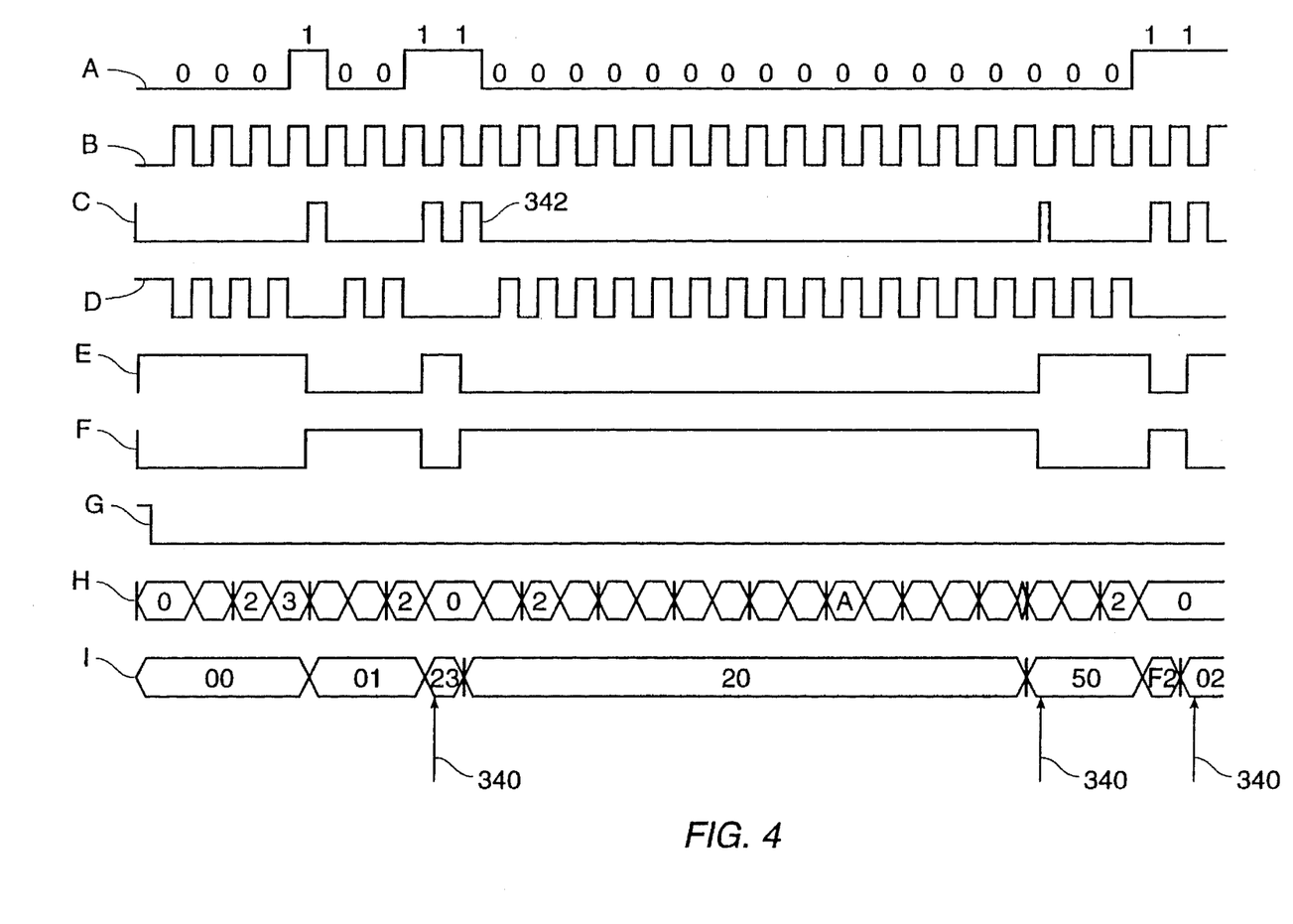
FIG. 4 shows the timing diagram of the circuit of FIG. 3 used to compress an example configuration file.

FIG. 4 shows a timing diagram of circuit 300 compressing the following memory pattern:

000100110000000000000000011

Signal A represents the above memory pattern, signal B represents the clock signal at DATACLK terminal 326, signal C represents the signal at the output of AND gate 316 (i.e. the GRAB signal), signal D represents the clock signal to counter 302, signals E and F represent clock signals to registers 304 and 306, signal G represents the signal at GRESET terminal 322, signal H represents the output of counter 302, and signal I represents the output of circuit 300.

As explained above, two GRAB signals are needed to load both registers 304 and 306. Therefore, valid compressed data is read on the falling edge of every other GRAB signal. Arrows 340 point to the position in signal C where valid signals are read. In the present example, counter 302 counts the number of low bits, which is three, until the first high bit is detected. Then, the binary value of three is loaded in register 306 as explained above with reference to FIG. 3. Since the first high bit has been detected, a zero initial count is reloaded in counter 302. The next low bit in the memory pattern forces counter 302 to start counting again. There are two other low bits in the data before the next high bit is detected.

Once the next high bit is detected, outputs QA–QD are loaded in register 304 as explained above. At this point, the outputs of register 304 and 306 are read and stored (not shown). The detected high bit forces a reloading of counter 302. The next bit is another high bit which forces the generation of another GRAB signal 342. This forces the loading of the information on outputs 328–331, which is the binary equivalent of zero, in register 306. This process continues until the whole memory pattern is compressed. The following shows the results of the example in FIG. 4.

Pattern: 000100110000000000000000011

Compressed: 0011001000001111001000000Note that the first four bits of the pattern "0001" are compressed as the BCH digit "3" or "0011" signifying three "0's" followed by a "1". The next three bits of the pattern "001" are compressed into the hexadecimal digit "2" or "0010" signifying two "0's" preceding a "1" bit. The next bit in the pattern is compressed as hexadecimal "0000" signifying no "0's" preceding a "1" bit, and bits 9 through 23 of the pattern are compressed as hexadecimal F or "1111" signifying a string of fifteen "0's" with no "1" bits It can be seen from the above that the compressed pattern has fewer bits than the un-compressed pattern. The above is for illustrative purposes only.

Figure 5:
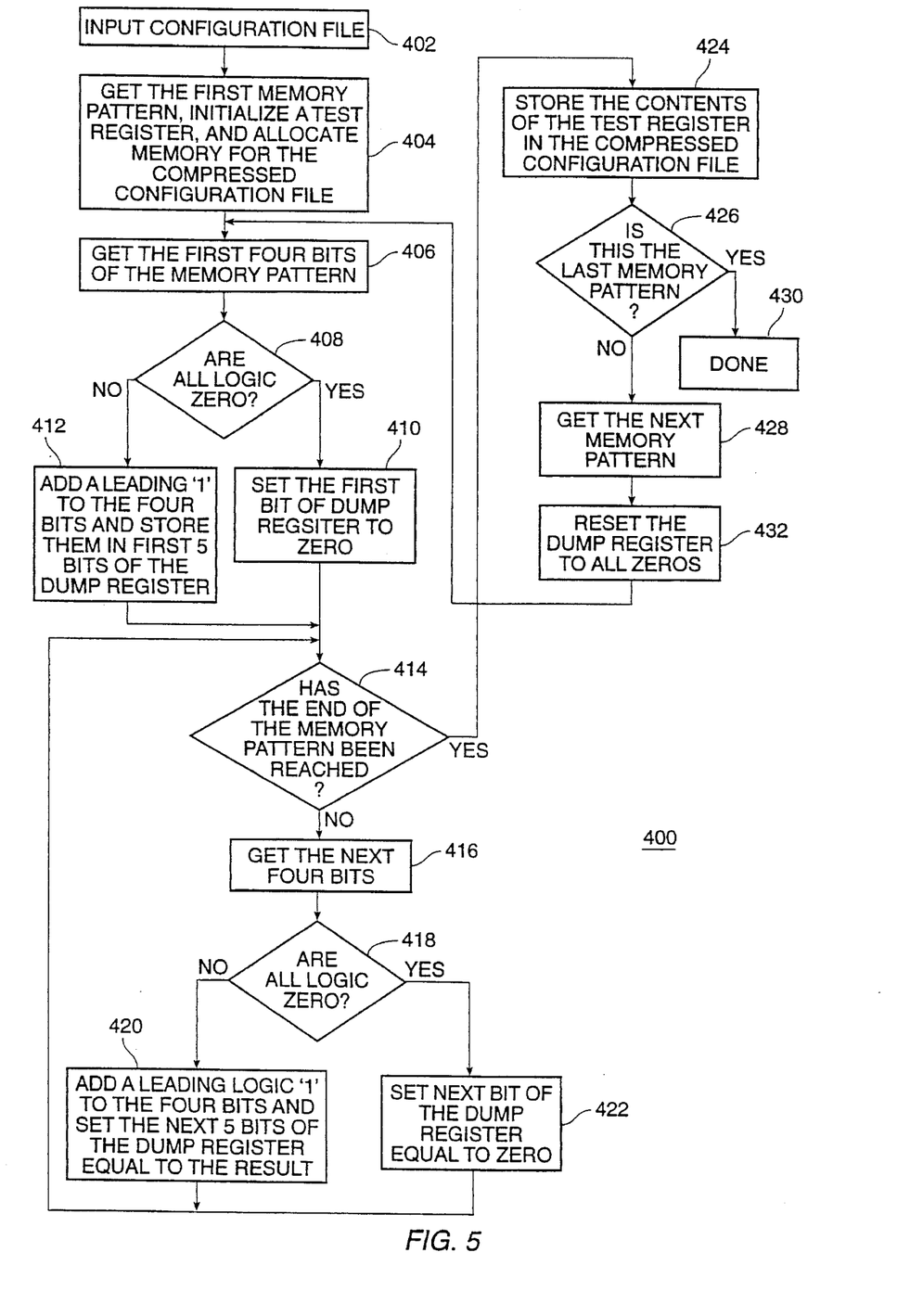
FIG. 5 is a flow chart which illustrates an alternative method in performing the compression in the present invention.

FIG. 5 shows an alternative method of performing the compression step 104 in FIG. 1. The compression process, according to the embodiment of FIG. 4, starts by obtaining the configuration file to be compressed in step 402. Next, process 400 selects the first memory pattern to be compressed, initializes a test register by loading a logic "0" in each individual register of the test register in step 404. The test register is used to temporarily store the compressed memory pattern and includes a fairly large number of individual registers. Each individual register holds one bit of compressed data.

In steps 406 and 408, the first four bits of the memory pattern are examined. If all are low level bits, the first bit of the test register is set to low in step 410 and the process proceeds to execute step 414. If any of the four bits is a high level bit, a leading high bit is added to the above four bits and the resulting five bits are stored in the first five registers of the test register in step 412. The process then proceeds to step 414.

In step 414, the compressor determines whether the four bits of data just examined were the last four bits in the memory pattern. If the answer is no, the next four bits of the memory pattern are examined in step 418. Again, if all are low level bits, process 400 sets the next bit of the test register to low level in step 422 and returns to step 414. If any of the four bits is a high level bit, process 400 adds a leading high level bit to the examined four bits and stores the resulting five bits in the next five bits of the test register. Process 400 then returns to step 414. Once in step 414, the compressor proceeds as explained above.

If the answer to the question in step 414 is yes, which means that the end of the memory pattern is reached, process 400 proceeds to step 424. In step 424, process 400 stores the content of the test register, which is the compressed version of the memory pattern. In step 426, process 400 determines whether the previous memory pattern was the last memory pattern in the configuration file. If no, process 400 selects the next memory pattern in step 428, re-initializes the test register in step 432, and proceeds to step 406. If the answer to the step 426 is yes, the compression is over. The resulting configuration file is then stored in the serial EPROM, as shown in step 106 of FIG. 1.

As mentioned before, the compression can be performed by software or hardware. In the former, the software tool residing in a host computer performs the compression step. In the latter, the compression step is performed by an electronic circuit, such as the one shown in FIG. 3. The electronic circuit can reside in the host computer or it can be packaged with the memory element used to store the compressed configuration files.

Figure 6:
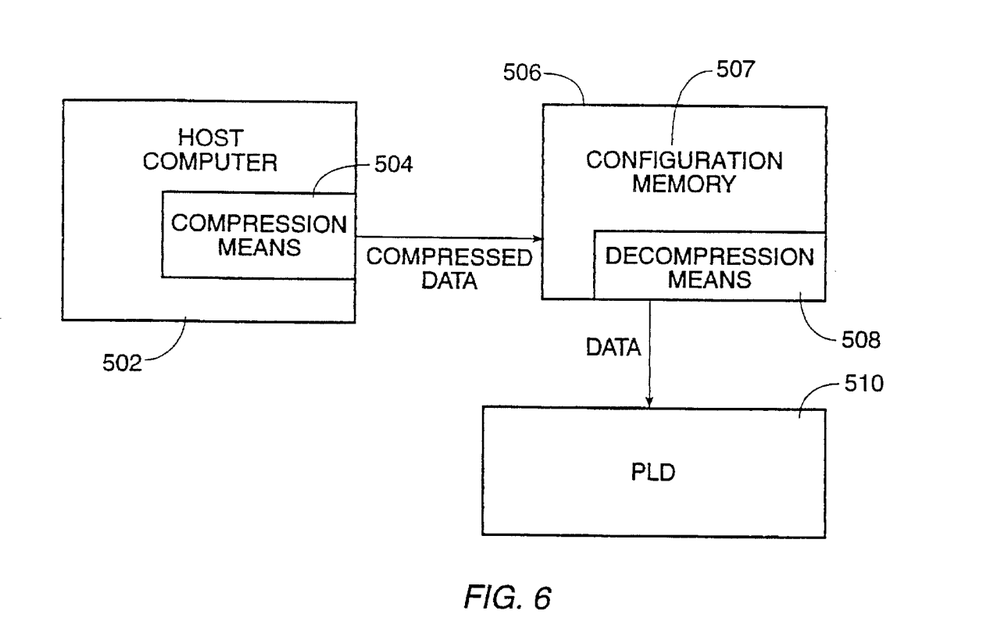
FIG. 6 shows one embodiment of the system according to the present invention.

FIG. 6 shows an embodiment of the system of the present invention where software is used to perform the compression step 104 in FIG. 1. FIG. 6 shows a host computer 502, compression software 504, serial device integrated circuit 506 which includes memory array 507 and decompression circuit 508, and programmable logic device 510. Host computer 502 can be any personal computer, such as IBM or IBM compatible personal computers, Macintosh personal computers, SUN or DEC (Digital Equipment Corporations) work stations.

In operation, the user generates one or more configuration files using a programming tool (not shown), such as the ALTERA MAX™ programming tools, supplied by the manufacturer of programmable logic device 510. Hereinafter, we will assume that only one configuration file is generated by the user. Compression software 504 can be a part of the programmable tool, or it can be a separate software tool used by the programming tool. Compression software 504 compresses the configuration file and generates a compressed configuration file. The compressed configuration file is then stored in memory array 507 of serial device 506. To program programmable logic device 510, the programming tool retrieves the stored configuration file from memory array 507 by addressing the memory locations where the compressed configuration file is stored. Since the output of memory array 507 is connected to the input of decompression circuit 508, the retrieved file is inputted into decompression circuit 508. Decompression circuit 508 decompresses the compressed configuration file and regenerates the original configuration file. The original configuration file is then used to program programmable logic device 510.

Figure 7:
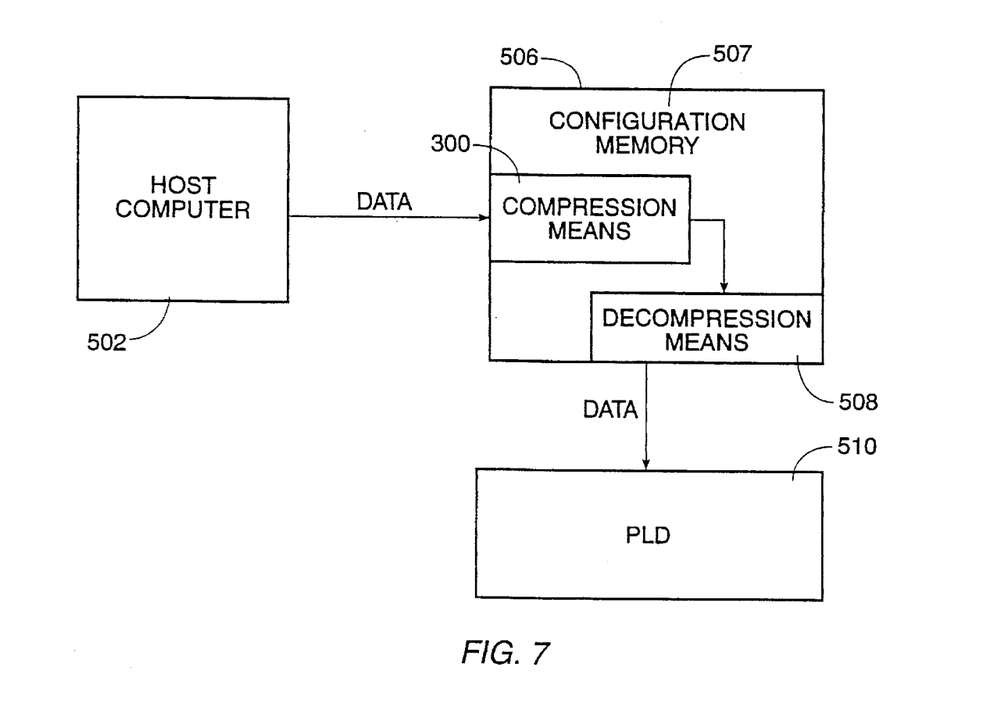
FIG. 7 shows a second embodiment of the system according to the present invention.

FIG. 7 shows the embodiment of the present invention wherein the compression is done by hardware. The system of FIG. 7 includes a host computer 502, a serial device integrated circuit 506, and a programmable logic device 510. Serial device integrated circuit 506 includes compression circuit 300 (refer to FIG. 3), memory array 507, and decompression circuit 508. Host computer 502 is of the type mentioned above.

In operation, the user generates a configuration file using the above-mentioned programming tool. The generated configuration file is then sent to serial device integrated circuit 506 to be stored. However, before storing the configuration file, it is compressed by compression circuit 300. The compressed configuration file is then stored in memory array 507. To program programmable logic device 510, the programming tool retrieves the stored configuration file from memory array 507 by addressing the memory locations where the compressed configuration file is stored. Since the output of memory array 507 is connected to the input of decompression circuit 508, the retrieved file is inputted into decompression circuit 508. Decompression circuit 508 decompresses the compressed configuration file and regenerates the original configuration file. The original configuration file is then used to program programmable logic device 510.

Figure 8:
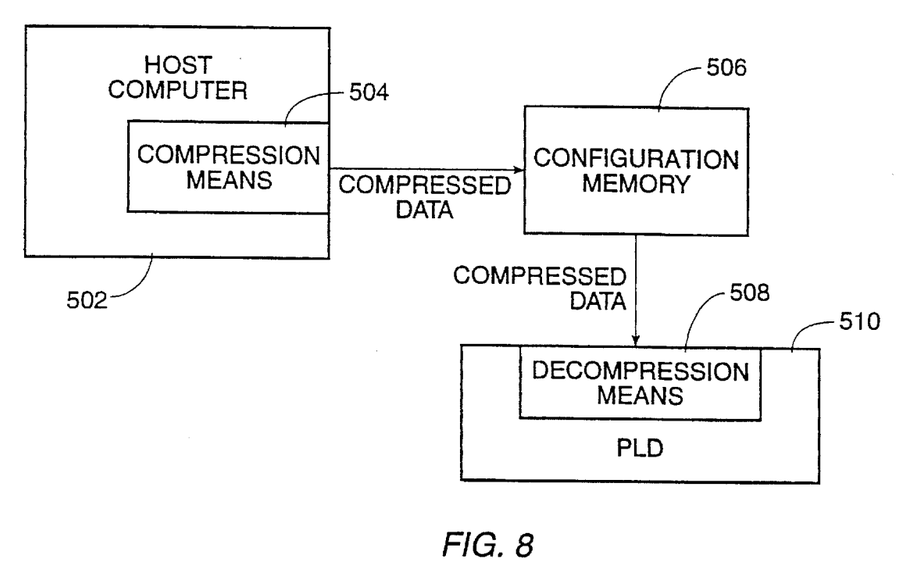
FIG. 8 shows a third embodiment of the system according to the present invention.
Figure 9:
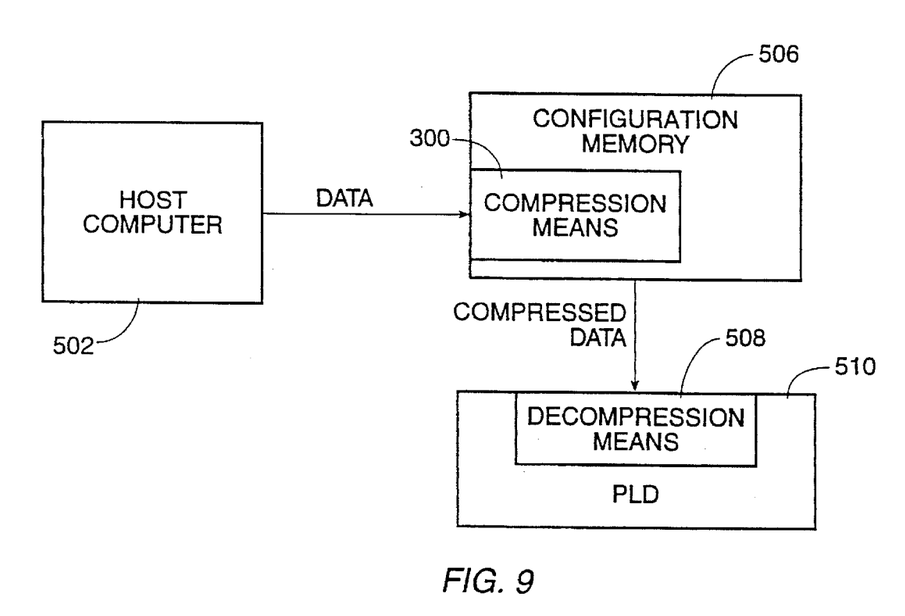
FIG. 9 shows a fourth embodiment of the system according to the present invention.

FIGS. 6 and 7 illustrate the situations where the decompression circuit is part of serial device integrated circuit 506. FIGS. 8 and 9 illustrate the embodiments of the present invention where decompression circuit 508 is part of programmable logic device 510.

FIG. 8 shows a host computer 502, compression software 504, serial device integrated circuit 506 which includes memory array 507, and programmable logic device 510 which includes decompression circuit 508.

FIG. 9 shows a host computer 502, a serial device integrated circuit 506, and a programmable logic device 510 which includes decompression circuit 508. Serial device integrated circuit 506 includes compression circuit 300 (refer to FIG. 3) and memory array 507.

As mentioned above, host computer 502 can be any personal computer, such as IBM or IBM compatible personal computers, Macintosh personal computers, SUN or DEC (Digital Equipment Corporations) work stations. The systems of FIGS. 8 and 9 operate exactly as do the systems in FIGS. 6 and 7, respectively, except that decompression circuit 508 now resides within the package of programmable logic device 510.

Figure 10:
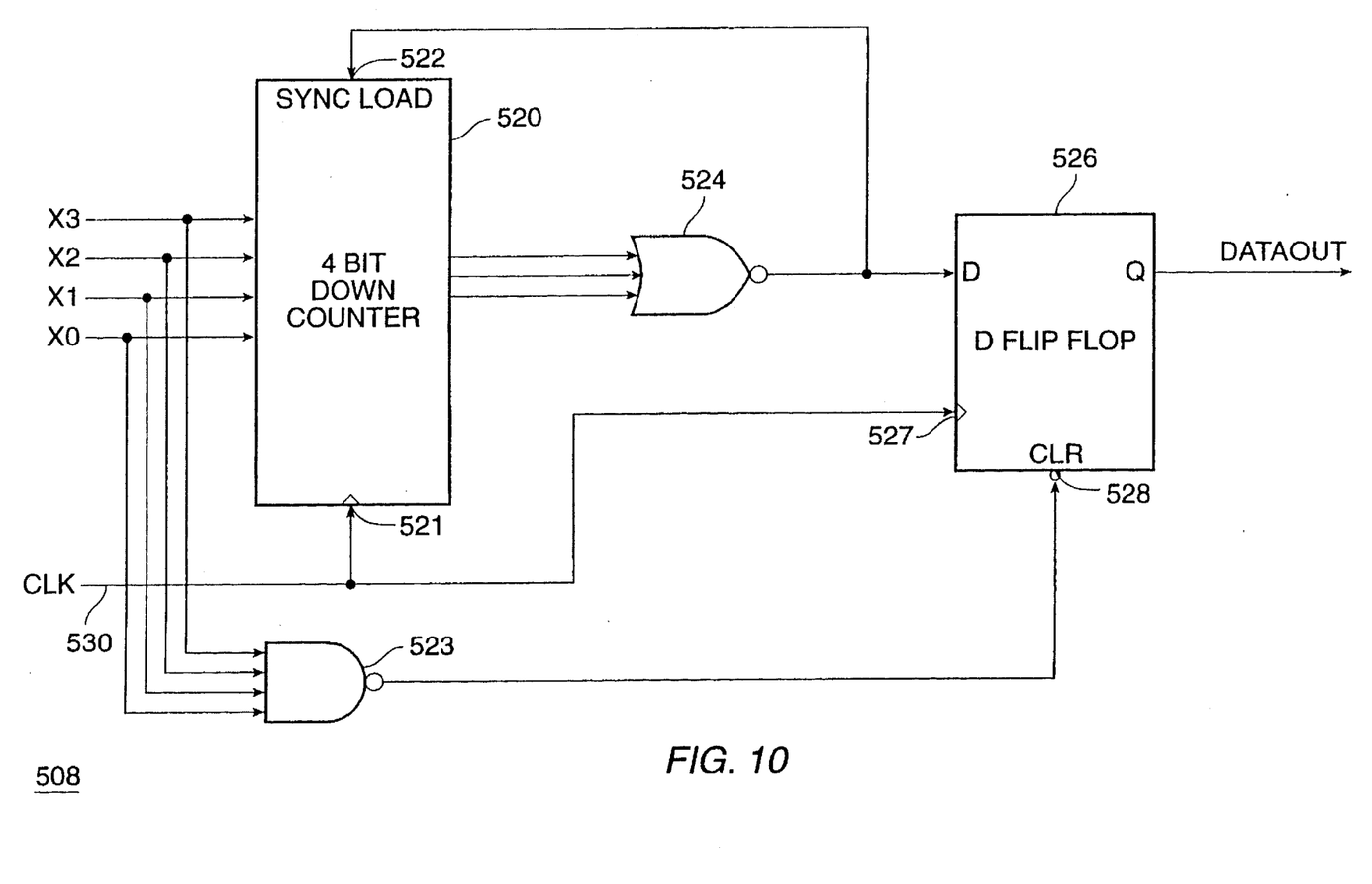
FIG. 10 shows a circuit diagram of a decompression circuit used in the present invention.

FIG. 10 illustrates an embodiment of decompression circuit 508 of FIGS. 6 and 7. FIG. 10 shows a 4-bit down counter 520, a 3input NOR gate 524, a 4-input NAND gate 523, and a "D" FF 526. Decompression circuit 508 operates on four parallel bits of the compressed configuration file at a time and generates output bits in response to the information on its four inputs.

As shown in FIG. 10, counter 520 includes four inputs which are connected to input lines X0–X3, a clock input 521 coupled to the system clock 530, and a SyncLoad input 522 which is connected to the output of NOR gate 524. Counter 520 further includes four outputs connected to the inputs of NOR gate 524. Input lines X0–X3 are also connected to the inputs of NAND gate 523. FF 526 includes a "D" input which is connected to the output of NOR gate 524, a clock input 527 which is connected to the system clock 530, a clear ("CLR") input 528 which is connected to the output of NAND gate 523, and a Q output.

The operation of circuit 508 is best understood through an example. Assume that input lines X0–X3 carry the BCH equivalent of the number five. As describe above, a four-bit binary equivalent of number five represents the situation where five low level bits were detected before a high level bit was detected in a memory pattern. Therefore, circuit 508 must generate six output bits. The first five bits are low level bits and the last bit is a high level bit. Also, assume that circuit 508 is initialized which means that the outputs of counter 520 are all set at low level. This generates a high level signal at the output of NOR gate 524, which is connected to SyncLoad input 522. As long as a high level signal is connected to SyncLoad input 522, the information on the input of counter 520 is loaded in as the initial count value. In the present example, the binary equivalent of the number five will be loaded in counter 520.

This immediately forces the output of NOR gate 524 to low. Since a continuous clock signal is connected to the clock input of FF 526, the next clock signal forces the output of FF 526 to low. Thus, a first low level bit is then generated. On the next clock signal the counter decrements its count value. A binary equivalent of the new count value appears on the outputs of counter 320. The output of NOR gate 524 remains at low level, which provides a low signal at the "D" input of FF 526. The next clock input to FF 526 will not change the level of its output, maintaining a low level at the output of FF 526. Thus, the second low level bit is generated.

This process continues for the next three clock signals. At the end of the third clock signal, the outputs of counter 520 carry the binary equivalent of zero. This forces the output of NOR gate 524 to high level, which places a high level at the output of FF 526. The next clock signal switches the output of FF 526 from low to high. Thus, the sixth bit, which is a high level bit, is generated. The above process continues until the end of the compressed configuration file is reached.

NAND gate 523 is provided for situations where X0–X3 are all high, which means that at least fifteen low bits were detected between two high bits. An all high level input to NAND gate 523, forces its output to low level. This provides a valid clear signal of FF 526 to the CLR input, which forces the Q output of FF 526 to remain low as long as X0–X3 are all high. Thus, for fifteen clock signals the output of FF 526 remains at low level. After fifteen clock signals, the next four bits in the compressed configuration file is provided to X0–X3 inputs. If any of the four inputs X0–X3 carry a low bit, the output of NAND gate 523 switches to high level, and circuit 508 functions as explained above.

The present invention has now been explained with reference to specific embodiments. Other embodiments will be apparent to those of ordinary skill in the art. It is therefore not intended that this invention be limited except as indicated by the appended claims.

What is claimed is:

1. A method of programming a programmable logic device, comprising:

compressing a configuration file by instructions in a digital computer to generate a compressed configuration file;

storing said compressed configuration file into a storage device used for programming said programmable logic device;

decompressing said compressed configuration file to generate a set of configuration data; and programming the programmable logic device using said set of configuration data, wherein said storage device comprises electronically programmable read only memory for storing said compressed configuration file and wherein said programmable logic device comprises an electronic decompression circuit to perform said decompression step.

2. The method of claim 1, wherein said compressing step comprises:

initializing a value of a count variable;

counting a number of first logic level bits in said input file before detecting a second logic level bit;

setting said value of said count variable equal to the result of said counting step; and generating a representation of said value of said count variable.

3. The method of claim 2 further comprising the steps of:

counting said first logic level bits before detecting a second one of said second logic level bit;

performing said setting and said generating steps; and re-initializing said value of said count variable.

4. The method of claim 3 further comprising generating said compressed configuration file from said representations of the value of said count variable.

5. The method of claim 4, wherein said compressed configuration file is generated by concatenating said representations.

6. The method of claim 2, wherein generating a representation of said count variable comprises generating a binary-coded hexadecimal equivalent of said value.

7. The method of claim 1, wherein said compressing step is done by an electronic compression circuit.

8. The method of claim 7, wherein said storage device comprises:

said electronic compression circuit;

electronically programmable read only memory for storing said compressed configuration file; and an electronic decompression circuit to perform said decompression step.

9. The method of claim 1, wherein said configuration file is larger than said compressed configuration file.

10. The method of claim 1, wherein said set of configuration data is equal in size to said configuration file.

11. The method of claim 1, wherein said decompression step is performed using a run-length decompression scheme.

12. A method of programming a programmable logic device, comprising:

compressing a configuration file to generate a compressed configuration file by instructions in a digital computer;

storing said compressed configuration file into a dedicated storage device used for programming said programmable logic device decompressing said compressed configuration file to generate a set of configuration data; and programming the programmable logic device using said set of configuration data wherein said storage device comprises:

an array of electronically programmable read only memory for storing said compressed configuration file; and an electronic decompression circuit to perform said decompression step.

13. The method of claim 12, wherein said compressing step comprises initializing a value of a count variable;

counting a number of first logic level bits in said input file before detecting a second logic level bit setting said value of said count variable equal to the result of said counting step; and generating a representation of said value of said count variable.

14. The method of claim 13 further comprising the steps of:

counting said first logic level bits before detecting a second one of said second logic level bit;

performing said setting and said generating steps; and re-initializing said value of said count variable.

15. The method of claim 14 further comprising generating said compressed configuration file from said representations of the value of said count variable.

16. The method of claim 15, wherein said compressed configuration file is generated by concatenating said representations.

17. The method of claim 13, wherein generating a representation of said count variable comprises generating a binary-coded hexadecimal equivalent of said value.

18. The method of claim 12, wherein said compressing step is done by software in a digital computer.

19. The method of claim 12, wherein said compressing step is done by an electronic compression circuit.

20. The method of claim 12, wherein said configuration file is larger than said compressed configuration file.

21. The method of claim 12, wherein said set of configuration data is equal in size to said configuration file.

22. A method of programming a programmable logic device, comprising:

compressing a configuration file to generate a compressed configuration file using an electronic compression circuit;

storing said compressed configuration file into a dedicated storage device used for programming said programmable logic device;

decompressing said compressed configuration file to generate a set of configuration data; and programming the programmable logic device using said set of configuration data wherein said storage device comprises said electronic compression circuit and electronically programmable read only memory for storing said compressed configuration file; and said programmable logic device comprises an electronic decompression circuit to perform said decompression step.

23. A method of programming a programmable logic device comprising the steps of:

compressing a data file before storing the file in a configuration memory;

compressing said data and storing compressed data in said first integrated circuit;

decompressing said compressed data to form a decompressed data stream; and programming the programmable logic device with said decompressed data stream.

24. An apparatus to be used in programming a programmable logic device, comprising:

compression means to compress an input file and to generate a first output file;

a storage device coupled to said compression means for receiving and storing said first output file;

decompression means on said storage device for decompressing said first output file to generate a second output file; and means to transfer said second output file to the programmable logic device.

25. Apparatus as in claim 24, wherein said input file is larger than said first output file.

26. Apparatus as in claim 24, wherein said input file and said second output file are equal in size.

27. Apparatus as in claim 24, wherein said compression means comprises a software compression program running on a development computer.

28. Apparatus as in claim 24, wherein said compression means comprises a compression circuit associated with a development computer.

29. Apparatus as in claim 24, wherein said decompression means comprises a run-length decompression circuit.

30. Apparatus for run length compressing a serial data file having a plurality of first and second logic level bits wherein said apparatus requires only a single data clock, comprising:

input terminal for inputting said serial data file;

clock terminal for inputting said data clock;

a counter having a plurality of inputs and outputs, said inputs connected so that said counter begins counting from zero when a reset signal is applied;

a plurality of parallel-in registers with inputs coupled to outputs of said counter, and outputs generating a compressed data file;

a logic gate with its inputs coupled to the outputs of said counter for generating a maximum signal indicating that said counter has reached its maximum count; and a first logic circuit for generating a grab signal with a first input coupled to said input terminal, a second input coupled to said clock terminal, a third input coupled to said maximum signal and a first output coupled to a clock input of said registers.

31. The apparatus of claim 30, wherein said counter counts a number of said first logic level bits in said data file before one of said second logic level bits is detected by said logic circuit.

32. The apparatus of claim 30, wherein said plurality of registers comprise first and second registers and further comprising:

a flip-flop with a clock input coupled to said grab signal, an first output coupled to a clock input of said first register and a second output coupled to a clock input of said second register.

33. The apparatus of claim 32, wherein said first register latches the output of said counter in response to said first clock signal.

34. The apparatus of claim 32, wherein said second register latches the output of said counter in response to said second output.

* * * * *